(12) United States Patent
Golov (10) Patent No.: US 11,681,469 B2
(45) Date of Patent: Jun. 20, 2023

(54) STORING AND RECOVERING CRITICAL DATA IN A MEMORY DEVICE

(71) Applicant: Micron Technology, Inc., Boise, ID (US)

(72) Inventor: Gil Golov, Backnang (DE)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 17/181,154

(22) Filed: Feb. 22, 2021

(65) Prior Publication Data

US 2022/0269438 A1    Aug. 25, 2022

(51) Int. Cl.
| | |
|---|---|
| *G06F 3/06* | (2006.01) |
| *G01K 1/14* | (2021.01) |
| *G01K 3/04* | (2006.01) |
| *G01K 1/02* | (2021.01) |

(52) U.S. Cl.
CPC ............ *G06F 3/0659* (2013.01); *G01K 1/14* (2013.01); *G01K 3/04* (2013.01); *G06F 3/0619* (2013.01); *G06F 3/0653* (2013.01); *G06F 3/0679* (2013.01); *G01K 1/026* (2013.01)

(58) Field of Classification Search
CPC .... G06F 3/0659; G06F 3/0619; G06F 3/0653; G06F 3/0679; G01K 1/14; G01K 3/04; G01K 1/026
See application file for complete search history.

(56) References Cited

U.S. PATENT DOCUMENTS

| | | | |
|---|---|---|---|
| 2016/0004437 A1* | 1/2016 | Kim .................. | G06F 3/0653 714/764 |
| 2016/0162219 A1* | 6/2016 | Erez .................. | G06F 1/206 711/103 |

* cited by examiner

*Primary Examiner* — David Yi
*Assistant Examiner* — Dustin B. Fulford
(74) *Attorney, Agent, or Firm* — Greenberg Traurig (57) ABSTRACT

The disclosed embodiments are related to storing critical data in a memory device such as Flash memory device. In one embodiment, a method performed by a controller of a memory device comprises receiving a critical operation from a host processor, the critical operation accessing a memory array; retrieving a temperature value of the memory array from a temperature sensor; and conditionally processing the critical operation based on the temperature value.

20 Claims, 6 Drawing Sheets

STORING AND RECOVERING CRITICAL DATA IN A MEMORY DEVICE

FIELD OF THE TECHNOLOGY

At least some embodiments disclosed herein relate generally to semiconductor devices and, in particular, to improving the storage integrity of Flash memory devices.

BACKGROUND

Due to the construction of Flash memory cells, a bit error rate increases during data read operations when such reads are executed in significantly different temperature environments when compared to the temperature that the data was written. For example, data written in warmer temperature and read in colder temperatures may experience an increase in the bit error rate and vice versa. This increase in the bit error rate appears in single-level cell (SLC) Flash cells but is most pronounced with multi-level cell (MLC) Flash memory cells.

In general, small variations (e.g., a few degrees Celsius) usually do not significantly increase the bit error rate, but storing data and reading it at different temperatures may increase the data error probability and reduces the data retention time of the Flash device. In extreme scenarios, the data might contain significant errors and may not be usable.

As one example, in automotive applications, data may be stored at 125° C. (e.g., when the automobile is running) or −40° C. (e.g., when the automobile is off in wintry conditions). If the data stored in such conditions is read at room temperature (e.g., 25° C.), additional errors may be introduced due to the expanded range between read and write temperatures. Further, the data retention time of the Flash memory may be significantly reduced.

While this impact may present inconveniences in many scenarios, it can cause critical and, in some cases, life-threatening errors in others. Critical applications such as black box recorders in vehicular systems and avionics systems, for example, may return errant data during operation when such reads occur. Further, for black boxes, data is frequently written at extreme temperatures and nearly always read at approximately room temperature.

Current Flash memories fail to account for temperature when performing reads and writes and thus cannot solve these and other problems.

DETAILED DESCRIPTION

The disclosed embodiments solve the aforementioned problems and other problems in the art. The disclosed embodiments employ a temperature sensor in a memory device to monitor the average temperature of the device. This temperature is redundantly stored in a separate region of memory when writing critical data and used when reading the same data to determine if the temperature variation will affect the integrity of the data read.

Figure 1:
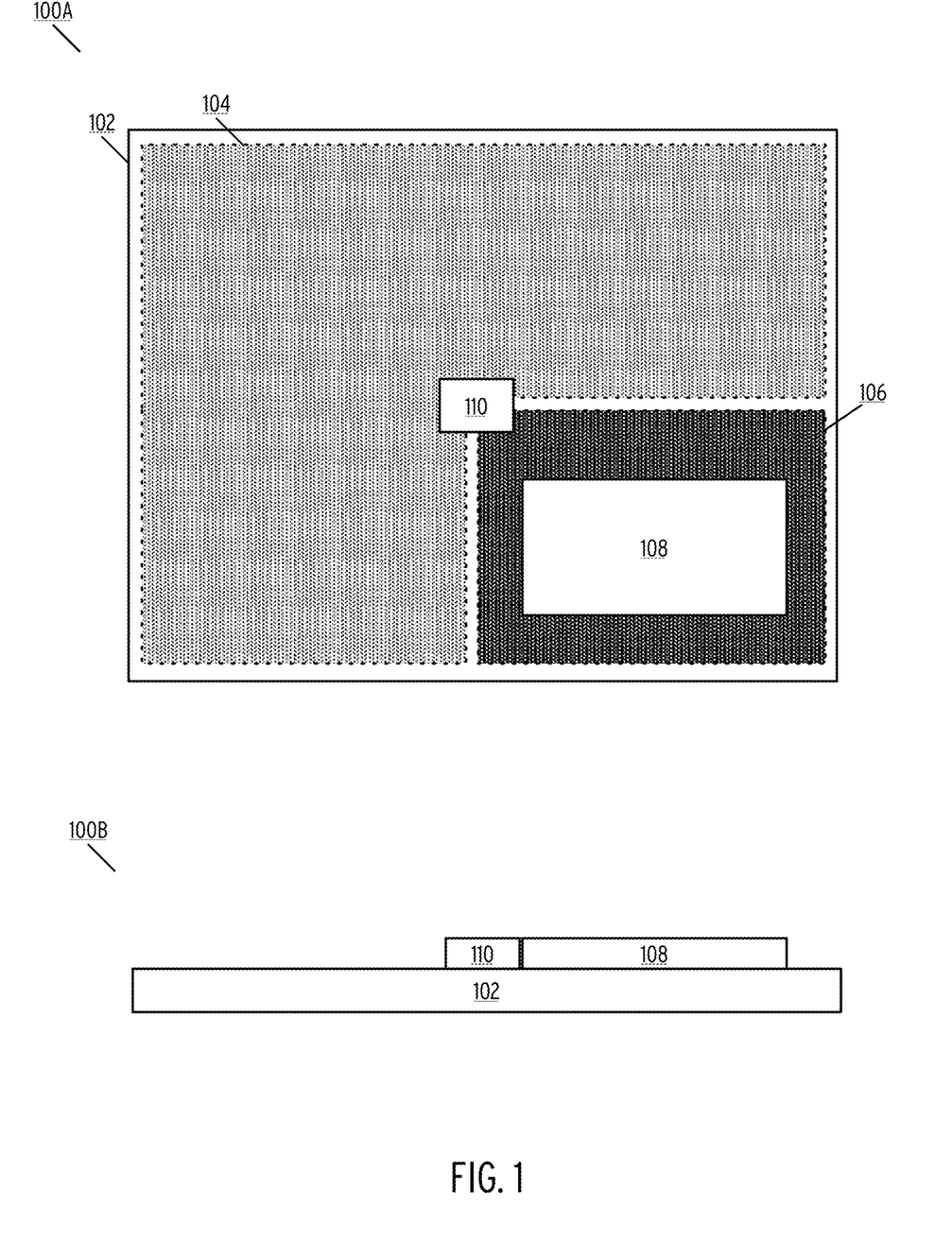
FIG. 1 is a diagram illustrating a Flash memory die according to some embodiments of the disclosure.

FIG. 1 is a diagram illustrating a Flash memory die according to some embodiments of the disclosure. FIG. 1 provides a top-down view (100a), and a side elevation view (100b) of a Flash memory die.

In the illustrated embodiment, the die includes a memory array portion (102). The array (102) may comprise a plurality of Flash memory cells. In one embodiment, the array (102) includes a plurality of SLC or MLC cells. In some embodiments, the array (102) is homogenous (i.e., including only SLC or MLC cells). In other embodiments, the array (102) may include multiple types of cells (i.e., a mix of SLC and MLC cells). Although reference is made to MLCs, other types of Flash memory cells may be used, such as triple-level cells (TLC), quad-level cells (QLC), penta-level cells (PLC), etc. In some embodiments, the cells may comprise pseudo-SLC (pSLC) cells. A pSLC cell comprises an MLC cell that may be configured to store a single bit of information, thus acting as an SLC cell. The array (102) may comprise a planar, two-dimensional (2D) array of memory cells. Alternatively, the array (102) may comprise a three-dimensional (3D) array of memory cells. The specific arrangement and type of cells in the array (102) is not intended to be unduly limiting.

In the illustrated embodiment, the array (102) extends across both axes of the Flash die. In other embodiments, the array (102) may only extend over a portion of the total die area. For example, the array (102) may be "L-shaped" wherein the controller (108) "fills" in the remainder of the die. In such an embodiment, the array (102) and controller (108) may be coplanar. However, in the illustrated embodiment, the controller (108) is situated above the memory array (102), as illustrated in the side elevation view (100b).

In the illustrated embodiment, the controller (108) and a temperature sensor (110) are situated above the memory array (102). The controller (108) is communicatively coupled to the array (102) via multiple conductive traces (not illustrated) or fabricated traces (not illustrated). Similarly, the temperature sensor (110) may be connected to the controller (108) via one or more conductive traces (not illustrated) or fabricated traces (not illustrated).

In the illustrated embodiment, the controller (108) mediates access to the underlying memory array (102). The controller (108) receives requests from a host processor and responds to these requests by accessing the memory array (102). Any techniques for using a controller to access an array of Flash memory may be implemented by the controller (108), and details of routine or rote operations are not repeated herein in detail. However, as will be discussed, the controller (108) may implement additional operations not found in existing controllers.

Specifically, the controller (108) may modify traditional read and write operations to utilize temperature readings recorded by the temperature sensor (110). In one embodiment, the sensor (110) may comprise a complementary metal-oxide-semiconductor (CMOS) sensor that monitors the temperature of the array (102) or the entire die housing the array (102). In the illustrated embodiment, the sensor (110) is centered in the middle of the array (102) or die. However, the specific placement of the sensor (110) is not intended to be limiting. That is, in some embodiments, the placement of the sensor (110) may be chosen based on the dimensions of the underlying memory array (102). In the illustrated embodiment, the memory array (102) is rectangular, and thus the sensor (110) is placed in the middle of the array (102) to capture a homogenous temperature reading of the entire array (102). In some embodiments, the sensor (110) may be positioned to be as far from the controller (108) as possible while still reading an average temperature of the array (102).

In the illustrated embodiment, the temperature of the array (102) includes a hot region (106) and a cooler region (104). These regions (104, 106) are illustrative only, and there may be no physical distinction in the memory array (102). In the illustrated embodiment, the hot region (106) comprises a region around the controller (108). In some embodiments, areas around a controller have higher temperatures due to the power consumption of the controller additively coupled to the power consumption of the memory cells. Thus, region (106) generally has a higher temperature than the region (104) that is further from the controller (108). Thus, the temperature of the cells within the memory array (102) will vary depending on whether a given cell is in the hot region (106) or cooler region (104).

In the illustrated embodiment, the sensor (110) measures the average temperature of the entire memory array (102) due to its placement in the middle of the array (102), or generally in a position that captures both hot and cooler regions (104, 106). As will be described in more detail herein, this temperature is used to modify read and write operations to account for temperature changes of the memory array.

Figure 2:
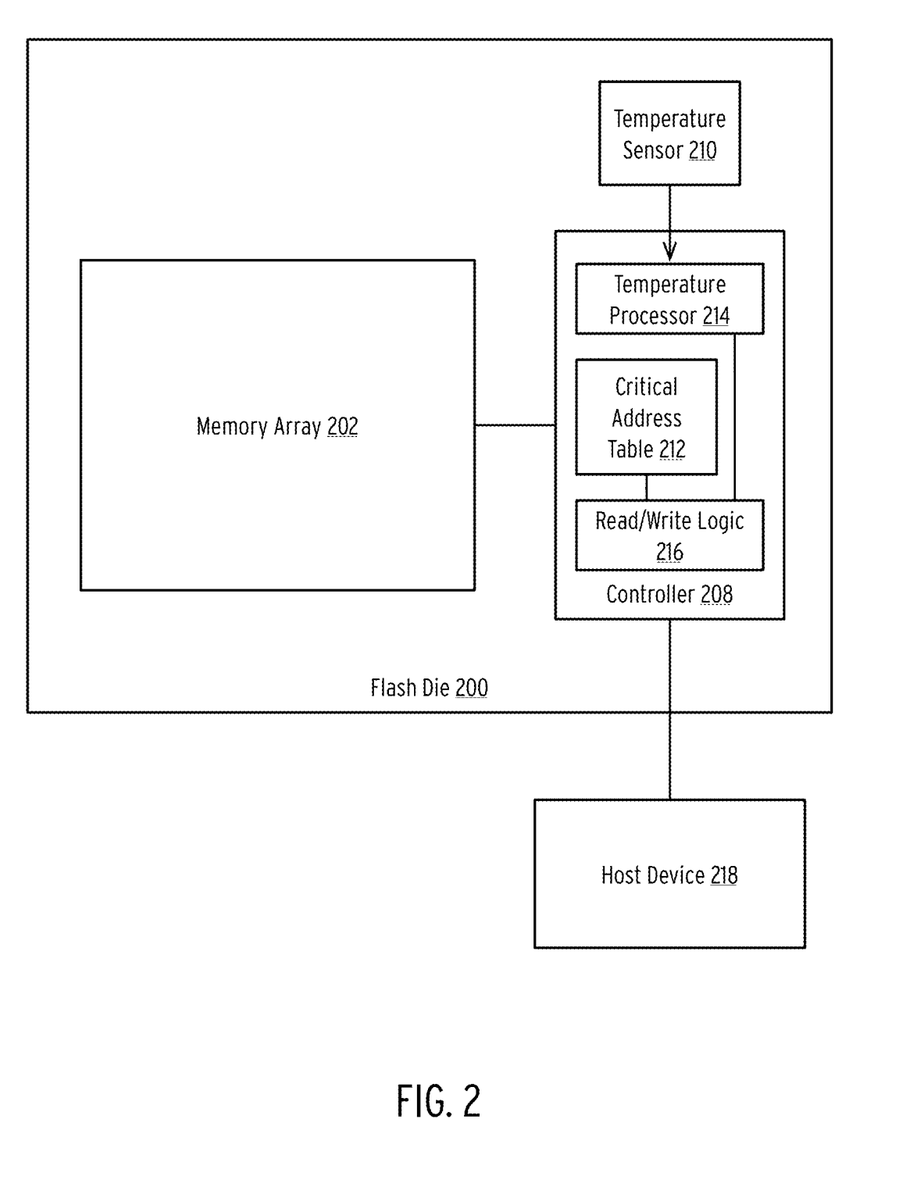
FIG. 2 is a block diagram of a memory device according to some embodiments of the disclosure.

FIG. 2 is a block diagram of a memory device according to some embodiments of the disclosure.

In the illustrated embodiment, a Flash die (200) includes a memory array (202), controller (208), and temperature sensor (210). The die (200) may comprise the die illustrated in FIG. 1 and, correspondingly, array (202), controller (208), and temperature sensor (210) correspond to the array (102), the controller (108), and sensor (110) of FIG. 1. The description of details of these components is not repeated herein, and emphasis is placed on the interaction between the components (202, 208, 210) herein.

In the illustrated embodiment, the sensor (210) periodically reports temperature readings to the controller (210) and, specifically, to a temperature processor (214). In one embodiment, the sensor (210) transmits temperature data of the die (202) to the temperature processor (214) at regular intervals (e.g., every 10 microseconds). Alternatively, or in conjunction with the foregoing, the temperature processor (214) may poll the sensor (210) are regular intervals. In this alternative, the temperature processor (214) can be configured to set the polling interval. In one embodiment, the polling interval may be a function of the last read temperature. For example, the temperature processor (214) may increase the polling frequency when the last read temperature passes a threshold (e.g., a high or low critical temperature) and decrease the polling interval when the temperature is within a moderate range. As an example, if the last read temperature is between −30° C. and 120° C., the temperature processor (214) may poll the sensor (210) at a first polling rate (e.g., 30 microseconds). When the last read temperature exceeds −30° C. or 120° C., the temperature processor (214) may increase the polling rate to a second rate (e.g., every 10 microseconds). When the temperature returns to between −30° C. and 120° C., the temperature processor (214) may return to the first polling rate. In this manner, the power consumption of the temperature processor (214) and thus controller (208) is reduced when the die (202) is operating in an acceptable temperature range. Thus, in some embodiments, the temperature processor (214) receives a stream of real-time temperature data from the sensor (210). In an alternative embodiment, the temperature processor (214) may be configured to read temperature data from the sensor (210) in response to read or write commands received by the read/write logic (216).

In the illustrated embodiment, the controller (208) receives write commands via the read/write logic (216). The write commands comprise instructions to write data to addresses of cells in the underlying memory array (202). As is described in more detail in FIG. 4A, some of this data to write may comprise critical data. In response to receiving critical data, the read/write logic (216) will identify a location to write the data by querying a critical access table (212). This table (212) stores locations that are located in a cooler region (e.g., 104) of the die (202). In the illustrated embodiment, the table (212) stores physical addresses of such locations and is used as part of the logical block address (LBA) to physical block address (PBA) mapping performed by read/write logic (216). This LBA/PBA mapping may be performed by a Flash translation layer according to various known techniques and may be modified by the processes described herein wherein the table (212) is used to identify the PBA as part of the translation. In some embodiments, the table (212) additionally stores addresses of temperature readout locations associated with a given PBA. Thus, for each address that the controller (208) writes critical data to, the table (212) stores one or more addresses of PBAs of the array (202) where temperature data is also written.

When writing critical data, and after identifying a PBA from the table (212), the temperature processor (214) reads the current die (202) temperature from the sensor (210). The read/write logic (216) then receives or retrieves the temperature from the temperature processor (214) and writes the temperature value to the memory array (202) along with the critical data. In one embodiment, the controller (208) may store the temperature values in the critical access table (212). Details of writing data are provided in the description of FIG. 4A and are not repeated herein.

The read/write logic (216) also receives requests to read data, including critical data. When reading critical data, the read/write logic (216) accesses the table (212) to identify the corresponding temperature values. The read/write logic (216) then determines whether to continue reading the critical data from the corresponding PBA stored in the table (212) based on the temperature values. Details of reading data are provided in the description of FIG. 4B and are not repeated herein.

Figure 3:
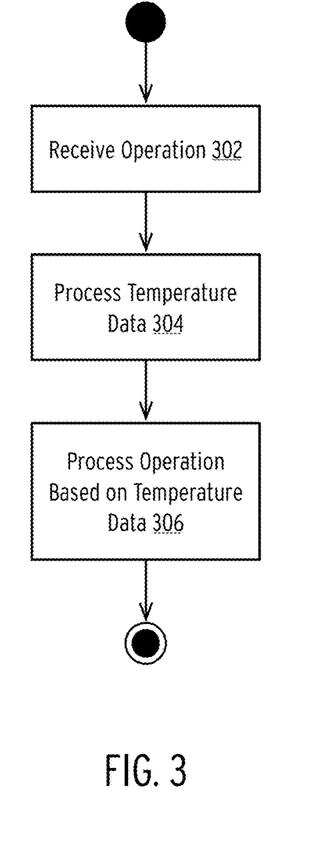
FIG. 3 is a flow diagram illustrating a method for mediating access to a memory array based on temperature data according to some embodiments of the disclosure.

FIG. 3 is a flow diagram illustrating a method for mediating access to a memory array based on temperature data according to some embodiments of the disclosure.

In step 302, the method receives an operation. In one embodiment, the operation comprises a read or write operation. In one embodiment, the operation includes an address of data. In one embodiment, the address comprises an LBA. In one embodiment, the address is included in both the read and write operations. For a write operation, the operation further includes data to write to the location. In some embodiments, the write operation may further include a flag or other identifier that signals that the data is critical data. In other embodiments, the method may determine that the data is critical data based on the data or address of the data. For example, the method can analyze the data format to determine if the data is critical data. In other embodiments, all writes to specific locations may be deemed writes of critical data. As used herein, a read operation that reads critical data is referred to as a critical read, and a write operation that writes critical data is referred to as a critical write. Critical read operations and critical write operations are referred to, collectively, as critical operations.

In some embodiments, the method may conditionally process operations. In these embodiments, the method determines if the operations are critical operations. If not, the method may process the operations normally in any manner performable by a memory device such as a Flash memory device. Alternatively, if the operations are critical operations, the method proceeds to step 304.

Although described in the context of reads and writes, any operation that accesses or affects critical data may also be processed as follows.

In step 304, the method processes temperature data. In one embodiment, the operation of step 304 may differ based on the type of operation.

If the operation is a critical write operation, the method may retrieve a current temperature value in step 304. As described above, the method may poll a temperature sensor to retrieve the current temperature of the memory array when receiving the critical write operation.

If the operation is a critical read operation, the method may read previously stored, or historic, temperature data that was written when the address accessed by the read operation was last written. The method may also poll a temperature sensor to retrieve the current temperature of the memory array when receiving the critical read operation. In some embodiments, the method may read multiple historic temperature data values as part of step 304 for critical read operations. Thus, for critical read operations, the method obtains a current temperature value and one or more historic temperature values.

In step 306, the method processes the operation based on the temperature data. As discussed above, when the operation is a critical operation, the method uses the temperature data retrieved in step 304 to modify the normal reading, writing, or accessing of critical data.

For critical write operations, the method writes the temperature data to multiple locations in the memory array along with writing the critical data to the memory array. The method will also update a table mapping critical data addresses to the addresses where temperature data is written. In one embodiment, the method will write the temperature data to an SLC or pSLC portion of the memory array, whereas the critical data may be written to any portion of the memory array. In one embodiment, the method will write the same temperature reading three times for redundancy.

For critical read operations, the method queries the table mapping critical data addresses to the addresses where temperature data is written and retrieves the addresses where historic temperature data associated with the address of critical data is stored. The method will then read these temperatures and determines which of the value to utilize based on, in one embodiment, a majority voter function. The method will then compare the selected temperature value to the current temperature read in step 304. Based on this comparison, the method may determine whether to read the critical data or raise an error.

The aforementioned embodiments are described for both read and write operations but, as mentioned, may be applied more generally to any access to a memory array. Details specific to write and read operations are described in more detail in FIGS. 4A and 4B below, respectively.

Figure 4A:
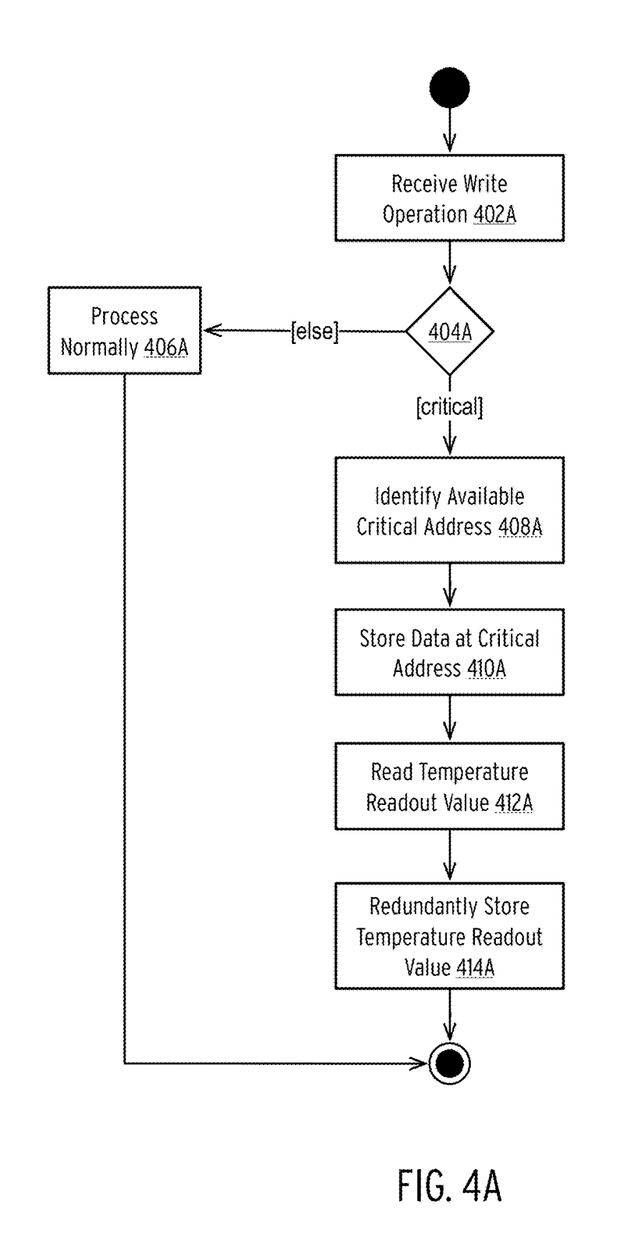
FIG. 4A is a flow diagram illustrating a method for processing a write operation based on temperature data according to some embodiments of the disclosure.

FIG. 4A is a flow diagram illustrating a method for processing a write operation based on temperature data according to some embodiments of the disclosure.

In step 402a, the method receives a write operation. In one embodiment, the write operation may comprise a critical write operation or a non-critical write operation. In general, a write operation includes at least a write address and data to write. In one embodiment, the write address comprises an LBA. In some embodiments, the write operation may include a flag indicating that the data is critical data. As discussed, a controller of a memory device receives the write operation from a host processor.

In step 404a, the method determines if the write operation is a critical write operation.

In one embodiment, the write operation includes a flag indicating that the data is critical data. This flag may comprise a single bit (e.g., an active-high bit). In this scenario, the method parses the write operation to determine if the flag is set. If so, the method determines that the write operation is a critical write operation.

In another embodiment, the method may determine that the write operation is a critical write operation based on the data or write address. In the former, the method may analyze the data to write to determine if the data includes critical data based on one or more pre-configured patterns of data to write. In the latter, the method may determine if the write address is designated to store critical data. If either determination is made, the method determines that the write operation is a critical write operation.

In another embodiment, the method may support two separate write commands: one for critical data and one for non-critical data. In this embodiment, the method determines if the opcode of the write operation matches a critical write opcode and, if so, determines that the write operation is a critical write operation.

If the method determines that the write operation is not a critical write operation, the method processes the write operation normally in step 406a. As used herein, processing an operation normally refers to using known techniques for writing to an underlying storage medium. For example, the method may perform an LBA-to-PBA mapping on the write command and proceed to write the data in the operation to the mapped PBA. Various other operations may be performed by the controller when performing a standard write and those operations are not described herein.

Alternatively, if the method determines that the write operation is a critical write operation, the method proceeds to step 408a to process the write operation based on temperature data.

In step 408a, the method identifies a critical address location to store the critical data. In one embodiment, the method queries a critical address table (e.g., 212) to identify one or more PBAs to store the critical data. In this respect, step 408a overrides a traditional LBA-to-PBA mapping by utilizing a range of PBAs that are dedicated to critical data. The critical addresses are generally located further from the controller in a cooler region (e.g., 104) of the memory die. In some embodiments, the method may raise an error if no critical addresses remain.

In step 410a, the method stores the critical data at the critical address location. In one embodiment, the method executes a program or write operation to write the data in the critical write operation to the critical address location. Details of programming a PBA or similar address are not described in detail herein and any techniques for writing data to a memory address may be used.

In step 412a, the method reads a temperature readout value. In one embodiment, the method queries or polls a temperature sensor of the memory device to obtain the temperature readout value. The temperature readout value read in step 412a is the current temperature of the memory device when the write in step 410a is made. In some embodiments, the temperature readout value comprises the average temperature of the memory device due to the placement of the temperature sensor, as previously discussed.

In step 414a, the method redundantly stores the temperature readout value.

In the illustrated embodiment, the method stores multiple copies of the temperature readout value read in step 412a. For example, in some embodiments, the method may write the temperature readout value to three separate locations in the memory device. In some embodiments, the locations storing the temperature readout values are in a cooler region of the memory device. In some embodiments, the temperature readout values are stored in SLC or pSLC locations of the underlying memory array. In general, any location that provides improved readout accuracy may be used, and SLC and pSLC are provided merely as examples.

In some embodiments, the method may further store the addresses where temperature readout values are written to memory, such as in the critical address table. In these embodiments, the method associates the critical address written to in 410a with the multiple addresses written to in 414a. Thus, in subsequent reads to the critical address location, the controller can look up the addresses of the temperature readout values associated with the critical address location.

In another embodiment, the addresses used for storing temperature data may be deterministically calculated based on the critical data address. Thus, no storage of the addresses used for storing temperature data may be necessary.

After writing the critical data in step 410a and writing the redundant temperature readout values in step 414a, the method returns a response to the host processor issuing the write operation. Specifics of the return response are not limiting and any mechanism for returning a response to a write operation may be utilized.

Figure 4B:
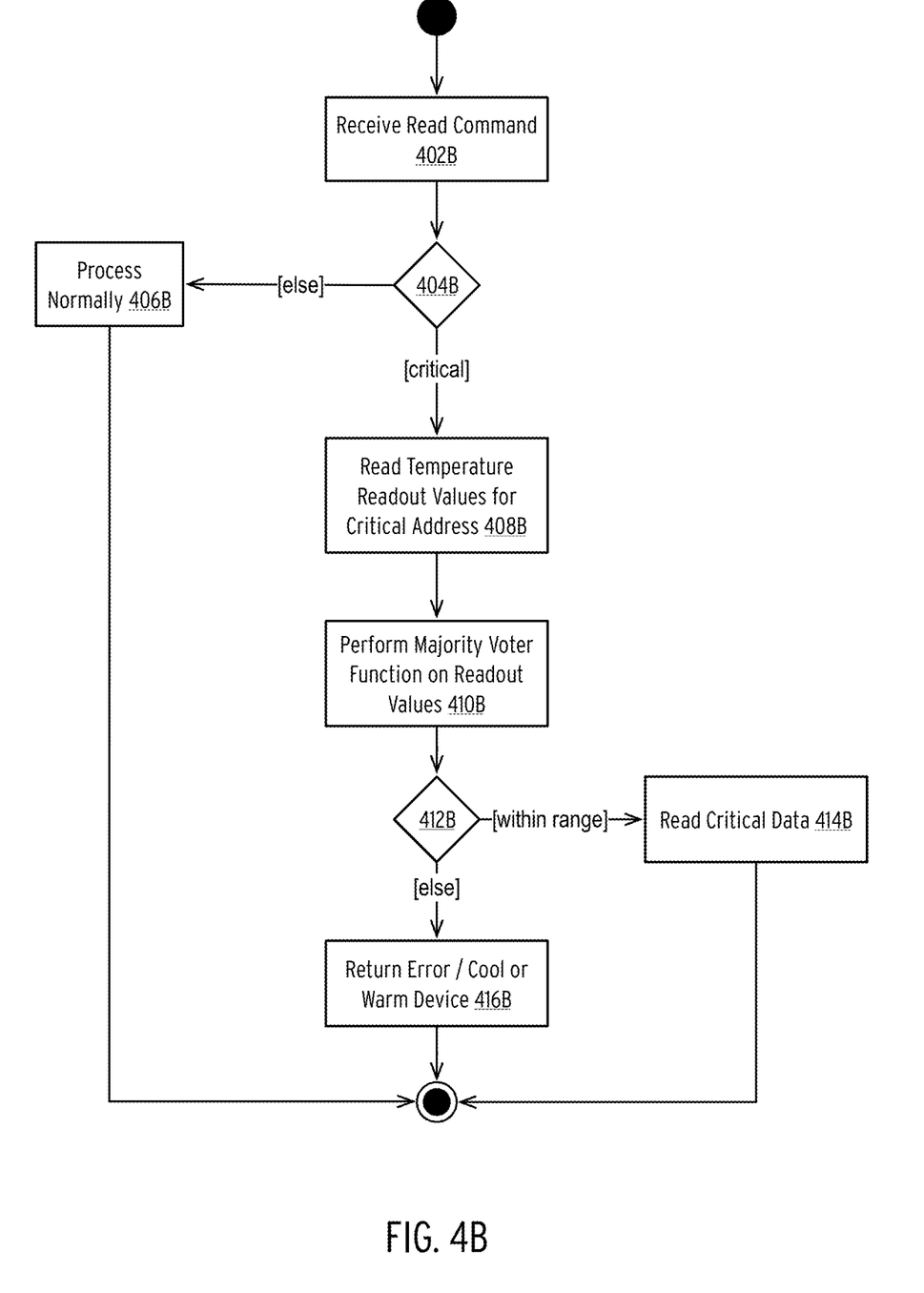
FIG. 4B is a flow diagram illustrating a method for processing a read operation based on temperature data according to some embodiments of the disclosure.

FIG. 4B is a flow diagram illustrating a method for processing a read operation based on temperature data according to some embodiments of the disclosure.

In step 402b, the method receives a read operation. In one embodiment, the read operation may comprise a critical read operation or a non-critical read operation. In general, a read operation includes at least a read address. In one embodiment, the read address comprises an LBA. In some embodiments, the read operation may include a flag indicating that data to read is critical data. As discussed, a controller of a memory device receives the read operation from a host processor.

In step 404b, the method determines if the read operation is a critical read operation.

In one embodiment, the read operation includes a flag indicating that the data to read is critical data. This flag may comprise a single bit (e.g., an active-high bit). In this scenario, the method parses the read operation to determine if the flag is set. If so, the method determines that the read operation is a critical read operation.

In another embodiment, the method may determine that the read operation is a critical read operation based on the read address. In this embodiment, the method may determine if the read address is designated to store critical data. If either determination is made, the method determines that the read operation is a critical read operation.

In another embodiment, the method may support two separate read commands: one for critical data and one for non-critical data. In this embodiment, the method determines if the opcode of the read operation matches a critical read opcode and, if so, determines that the read operation is a critical read operation.

If the method determines that the read operation is not a critical read operation, the method processes the read operation normally in step 406b. As used herein, processing an operation normally refers to using known techniques for writing to an underlying storage medium. For example, the method may perform an LBA-to-PBA mapping on the read command and proceed to read the data in the operation to the mapped PBA. Various other operations may be performed by the controller when performing a standard read and those operations are not described herein.

Alternatively, if the method determines that the read operation is a critical read operation, the method proceeds to step 408b to process the read operation based on temperature data.

In step 408b, the method reads temperature readout values for a critical address corresponding to the critical read. In one embodiment, the method uses the critical read address to query a critical address table. As described above, in some embodiments, the critical address table maps critical data addresses to a plurality of addresses that store temperature readout values. In another embodiment, the addresses used for storing temperature data may be deterministically calculated based on the critical data address. After identifying the addresses, the method reads the temperature readout values from each of the addresses.

In step 410b, the method performs a majority voter function on the readout values. In one embodiment, a majority voter function comprises a function that returns the temperature readout value stored by a majority of the addresses storing temperature data. Thus, if two out of three addresses store the same temperature value and a third address stores a different value, the value stored by the two out of three addresses will be considered the temperature value output of the majority voter function. In some embodiments, a value used in the majority voter function may have a tolerance value that allows for deviations from exact equality. Thus, the majority voter function compares ranges of temperatures rather than fixed values. In the illustrated embodiment, the output of the majority voter function is an agreed-upon temperature value with, in some embodiments, a tolerance. Thus, if the addresses return (50° C., 50° C., 100° C.), the majority voter function will return a value of 50° C.

In step 412b, the method analyzes the output of the majority voter function. If a majority of the values read from the addresses are within range, the method reads the critical data. In the illustrated embodiment, the method may utilize a fixed range to determine whether a read will be successful. This range is indicative of a temperature tolerance for temperature differences between write and read temperatures.

In the illustrated embodiment, the method reads the current temperature from the temperature sensor. Next, the method subtracts the output temperature from the majority voter function from the current temperature. In some embodiments, the method may compute the absolute value of the difference. The method then compares the difference to a fixed value. If the difference is less than the fixed value, the method proceeds to step 414*b*, otherwise the method proceeds to step 416*b*.

Continuing the previous example where the output of the majority voter function is 50° C., the current temperature may be 55° C. and the fixed value maybe 20° C. In this example, the difference is 5° C. and is thus less than the fixed value of 20° C., thus the method would proceed to step 414*b*. Alternatively, if the current temperature was 100° C. (or −100° C.), the difference would be 50° C. and thus exceed the fixed value of 20° C. In this scenario, the method would proceed to step 416*b*.

In step 414*b*, the method has determined that the temperature difference is in range and reads the critical data from memory. In the illustrated embodiment, the method may read data from memory using standard read operations as known in the art. Notably, the method can be reasonably certain that the critical data will be read properly since the temperature variation is within range.

Alternatively, in step 416*b*, the method determines that the temperature difference is too extreme (i.e., exceeds the fixed value) and thus reading the critical data will be unstable due to the large variation in write vs. read temperature.

In one embodiment, the method will not read the critical data from the memory device and, instead, will return an error code or similar structure significantly that the read operation failed. In another embodiment, the method may read the critical data but return a flag indicating that the data may be corrupt. In this embodiment, the host processor will be responsible for determining whether to further process the critical data given an error may have occurred.

Alternatively, or in conjunction with the foregoing, the method may also include cooling down or warming up the device. In the illustrated embodiment, the method may first determine whether the temperature readout value is above or below the current temperature and may then cool or warm the device, respectively, to reduce the temperature difference. In this embodiment, the memory device may be placed within a temperature chamber to warm or cool the device. The method may then continuously monitor the difference between the temperature in the temperature chamber and the output of the majority voter function until the difference is below the fixed value. Once the difference is within range (412*b*), the method can proceed to step 414*b*.

Figure 5:
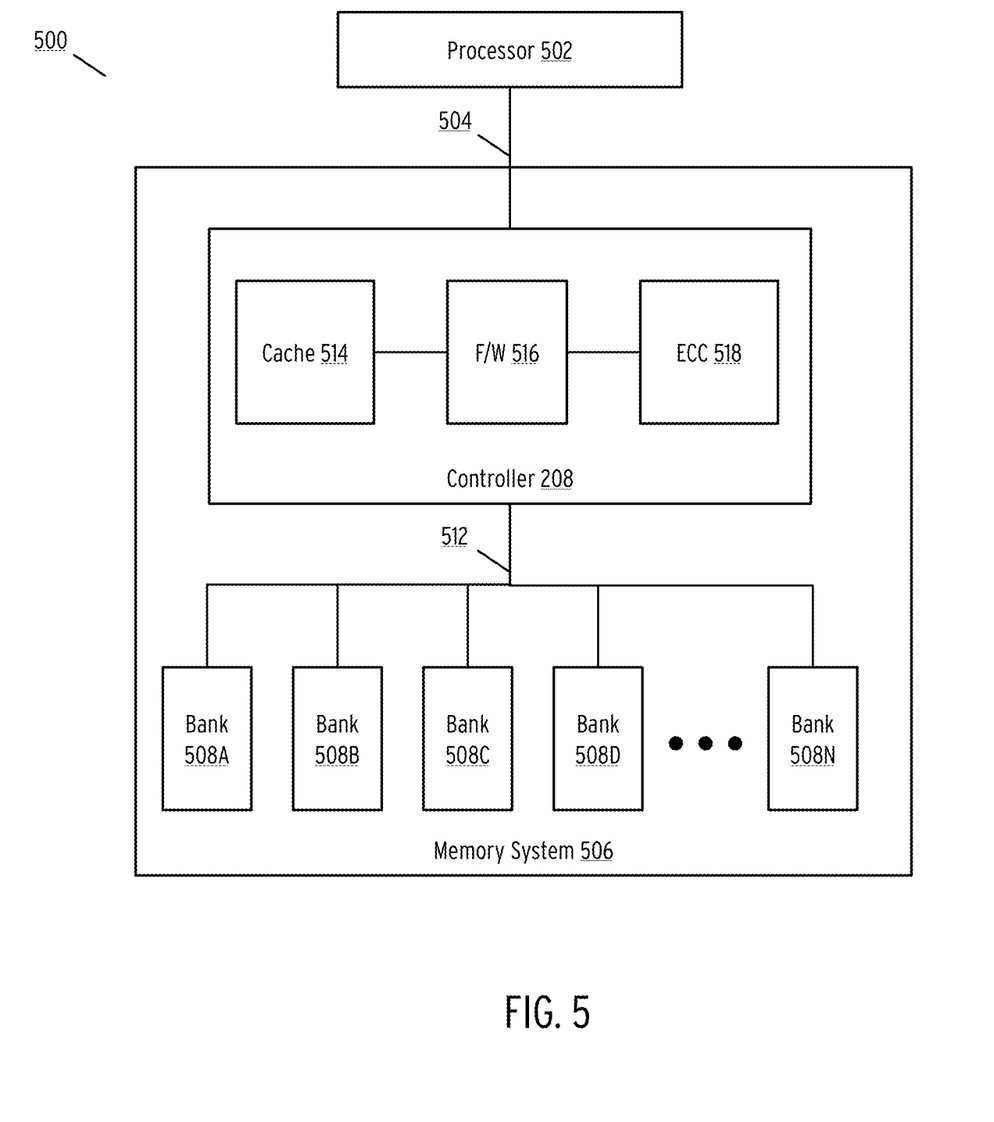
FIG. 5 is a block diagram illustrating a memory system according to some embodiments of the disclosure.

FIG. 5 is a block diagram illustrating a memory system according to some embodiments of the disclosure.

As illustrated in FIG. 5, a computing system (500) includes a processor (502) communicatively coupled to a memory system (506) via a bus (504). The memory system (506) comprises a controller (208) communicatively coupled to one or more memory banks (508*a*-508*n*) via a bus/interface (512). As illustrated, the controller (208) includes a local cache (514), firmware (516), and an ECC module (520).

In the illustrated embodiment, processor (502) can comprise any type of computer processor such as a central processing unit, graphics processing unit, or other types of general-purpose or special-purpose computing devices. Processor (502) includes one or more output ports that allow for the transmission of address, user, and control data between processor (502) and the memory system (506). In the illustrated embodiment, this communication is performed over bus (504). In one embodiment, the bus (504) comprises an input/output (I/O) bus or similar type of bus.

The memory system (506) is responsible for managing one or more memory banks (508*a*-508*n*). In one embodiment, the banks (508*a*-508*n*) comprise NAND Flash dies or other configurations of non-volatile memory. In one embodiment, the memory banks (508*a*-508*n*) comprise a memory array such as memory array (202).

The banks (508A-508N) are managed by the controller (208). In some embodiments, the controller (208) comprises a computing device configured to mediate access to and from banks (508*a*-508*n*). In one embodiment, the controller (208) comprises an ASIC or other circuitry installed on a printed circuit board housing the banks (508*a*-508*n*). In some embodiments, the controller (208) may be physically separate from the banks (508*a*-508*n*). Controller (208) communicates with the banks (508A-508N) over interface (512). In some embodiments, this interface (512) comprises a physically wired (e.g., traced) interface. In other embodiments, the interface (512) comprises a standard bus for communicating with banks (508A-508N).

Controller (208) comprises various modules (514-518). In one embodiment, the various modules (514-518) comprise various physically distinct modules or circuits. In other embodiments, the modules (514-518) may completely (or partially) be implemented in software or firmware. In some embodiments, the modules (514-518) are provided in addition to temperature processor (214), critical address table (212), and read/write logic (216) described previously.

As illustrated, firmware (516) comprises the core of the controller and manages all non-operations of the controller (208). The firmware (516) may implement some or all of the methods described herein. In one embodiment, the firmware (516) may implement the temperature processor (214), critical address table (212), and read/write logic (216) described previously.

Figure 6:
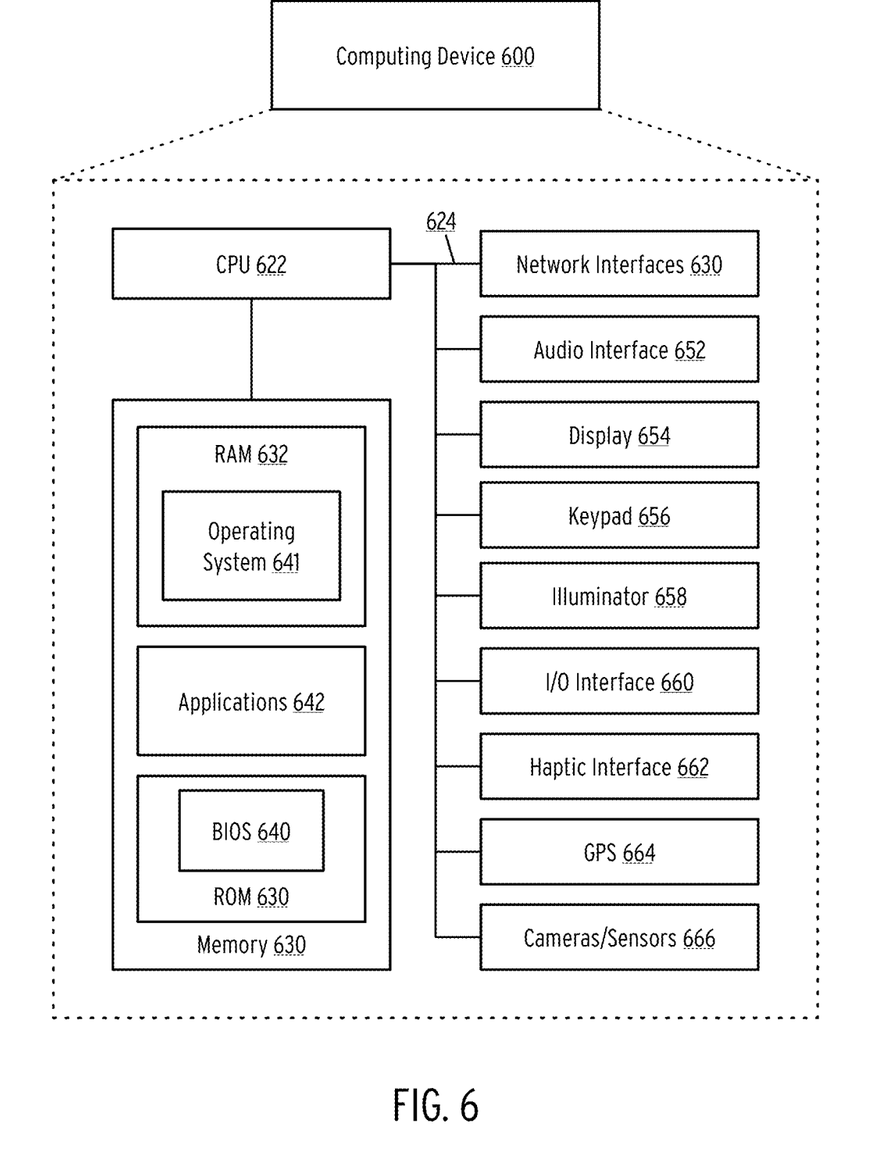
FIG. 6 is a block diagram illustrating a computing device showing an example embodiment of a computing device used in the various embodiments of the disclosure.

FIG. 6 is a block diagram illustrating a computing device showing an example embodiment of a computing device used in the various embodiments of the disclosure.

The computing device (600) may include more or fewer components than those shown in FIG. 6. For example, a server computing device may not include audio interfaces, displays, keypads, illuminators, haptic interfaces, GPS receivers, cameras, or sensors.

As shown in the figure, the device (600) includes a processing unit (CPU) (622) in communication with a mass memory (630) via a bus (624). The computing device (600) also includes one or more network interfaces (650), an audio interface (652), a display (654), a keypad (656), an illuminator (658), an input/output interface (660), a haptic interface (662), an optional global positioning systems (GPS) receiver (664) and a camera(s) or other optical, thermal, or electromagnetic sensors (666). Device (600) can include one camera/sensor (666), or a plurality of cameras/sensors (666), as understood by those of skill in the art. The positioning of the camera(s)/sensor(s) (666) on the device (600) can change per device (600) model, per device (600) capabilities, and the like, or some combination thereof.

The computing device (600) may optionally communicate with a base station (not shown), or directly with another computing device. Network interface (650) is sometimes known as a transceiver, transceiving device, or network interface card (NIC).

The audio interface (652) produces and receives audio signals such as the sound of a human voice. For example, the audio interface (652) may be coupled to a speaker and microphone (not shown) to enable telecommunication with others or generate an audio acknowledgment for some action. Display (654) may be a liquid crystal display (LCD), gas plasma, light-emitting diode (LED), or any other type of display used with a computing device. Display (654) may also include a touch-sensitive screen arranged to receive input from an object such as a stylus or a digit from a human hand.

Keypad (656) may comprise any input device arranged to receive input from a user. Illuminator (658) may provide a status indication or provide light.

The computing device (600) also comprises input/output interface (660) for communicating with external devices, using communication technologies, such as USB, infrared, Bluetooth™, or the like. The haptic interface (662) provides tactile feedback to a user of the client device.

Optional GPS transceiver (664) can determine the physical coordinates of the computing device (600) on the surface of the Earth, which typically outputs a location as latitude and longitude values. GPS transceiver (664) can also employ other geo-positioning mechanisms, including, but not limited to, triangulation, assisted GPS (AGPS), E-OTD, CI, SAL ETA, BSS, or the like, to further determine the physical location of the computing device (600) on the surface of the Earth. In one embodiment, however, the computing device (600) may through other components, provide other information that may be employed to determine a physical location of the device, including, for example, a MAC address, Internet Protocol (IP) address, or the like.

Mass memory (630) includes a RAM (632), a ROM (634), and other storage means. Mass memory (630) illustrates another example of computer storage media for storage of information such as computer-readable instructions, data structures, program modules, or other data. Mass memory (630) stores a basic input/output system ("BIOS") (640) for controlling the low-level operation of the computing device (600). The mass memory also stores an operating system (641) for controlling the operation of the computing device (600).

Applications (642) may include computer-executable instructions which, when executed by the computing device (600), perform any of the methods (or portions of the methods) described previously in the description of the preceding Figures. In some embodiments, the software or programs implementing the method embodiments can be read from hard disk drive (not illustrated) and temporarily stored in RAM (632) by CPU (622). CPU (622) may then read the software or data from RAM (632), process them, and store them to RAM (632) again.

The disclosure includes various devices which perform the methods and implement the systems described above, including data processing systems which perform these methods, and computer readable media containing instructions which when executed on data processing systems cause the systems to perform these methods.

The description and drawings are illustrative and are not to be construed as limiting. Numerous specific details are described to provide a thorough understanding. However, in certain instances, well-known or conventional details are not described in order to avoid obscuring the description. References to one or an embodiment in the present disclosure are not necessarily references to the same embodiment; and, such references mean at least one.

Reference in this specification to "one embodiment" or "an embodiment" means that a particular feature, structure, or characteristic described in connection with the embodiment is included in at least one embodiment of the disclosure. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments, but not other embodiments.

In this description, various functions and operations may be described as being performed by or caused by software code to simplify description. However, those skilled in the art will recognize what is meant by such expressions is that the functions result from the execution of the code by one or more processors, such as a microprocessor, Application-Specific Integrated Circuit (ASIC), graphics processor, and/or a Field-Programmable Gate Array (FPGA). Alternatively, or in combination, the functions and operations can be implemented using special purpose circuitry (e.g., logic circuitry), with or without software instructions. Embodiments can be implemented using hardwired circuitry without software instructions, or in combination with software instructions. Thus, the techniques are not limited to any specific combination of hardware circuitry and software, nor to any particular source for the instructions executed by a computing device.

While some embodiments can be implemented in fully functioning computers and computer systems, various embodiments are capable of being distributed as a computing product in a variety of forms and are capable of being applied regardless of the particular type of machine or computer-readable media used to actually effect the distribution.

At least some aspects disclosed can be embodied, at least in part, in software. That is, the techniques may be carried out in a computing device or other system in response to its processor, such as a microprocessor, executing sequences of instructions contained in a memory, such as ROM, volatile RAM, non-volatile memory, cache or a remote storage device.

Routines executed to implement the embodiments may be implemented as part of an operating system, middleware, service delivery platform, SDK (Software Development Kit) component, web services, or other specific application, component, program, object, module or sequence of instructions referred to as "computer programs." Invocation interfaces to these routines can be exposed to a software development community as an API (Application Programming Interface). The computer programs typically comprise one or more instructions set at various times in various memory and storage devices in a computer, and that, when read and executed by one or more processors in a computer, cause the computer to perform operations necessary to execute elements involving the various aspects.

A machine-readable medium can be used to store software and data which when executed by a computing device causes the device to perform various methods. The executable software and data may be stored in various places including, for example, ROM, volatile RAM, non-volatile memory and/or cache. Portions of this software and/or data may be stored in any one of these storage devices. Further, the data and instructions can be obtained from centralized servers or peer to peer networks. Different portions of the data and instructions can be obtained from different centralized servers and/or peer to peer networks at different times and in different communication sessions or in a same communication session. The data and instructions can be obtained in entirety prior to the execution of the applications. Alternatively, portions of the data and instructions can be obtained dynamically, just in time, when needed for execution. Thus, it is not required that the data and instructions be on a machine-readable medium in entirety at a particular instance of time.

Examples of computer-readable media include but are not limited to recordable and non-recordable type media such as volatile and non-volatile memory devices, read only memory (ROM), random access memory (RAM), flash memory devices, solid-state drive storage media, removable disks, magnetic disk storage media, optical storage media (e.g., Compact Disk Read-Only Memory (CD ROMs), Digital Versatile Disks (DVDs), etc.), among others. The computer-readable media may store the instructions.

In general, a tangible or non-transitory machine-readable medium includes any mechanism that provides (e.g., stores) information in a form accessible by a machine (e.g., a computer, mobile device, network device, personal digital assistant, manufacturing tool, any device with a set of one or more processors, etc.).

In various embodiments, hardwired circuitry may be used in combination with software and firmware instructions to implement the techniques. Thus, the techniques are neither limited to any specific combination of hardware circuitry and software nor to any particular source for the instructions executed by a computing device.

Various embodiments set forth herein can be implemented using a wide variety of different types of computing devices. As used herein, examples of a "computing device" include, but are not limited to, a server, a centralized computing platform, a system of multiple computing processors and/or components, a mobile device, a user terminal, a vehicle, a personal communications device, a wearable digital device, an electronic kiosk, a general purpose computer, an electronic document reader, a tablet, a laptop computer, a smartphone, a digital camera, a residential domestic appliance, a television, or a digital music player. Additional examples of computing devices include devices that are part of what is called "the internet of things" (IOT). Such "things" may have occasional interactions with their owners or administrators, who may monitor the things or modify settings on these things. In some cases, such owners or administrators play the role of users with respect to the "thing" devices. In some examples, the primary mobile device (e.g., an Apple iPhone) of a user may be an administrator server with respect to a paired "thing" device that is worn by the user (e.g., an Apple watch).

In some embodiments, the computing device can be a computer or host system, which is implemented, for example, as a desktop computer, laptop computer, network server, mobile device, or other computing device that includes a memory and a processing device. The host system can include or be coupled to a memory sub-system so that the host system can read data from or write data to the memory sub-system. The host system can be coupled to the memory sub-system via a physical host interface. In general, the host system can access multiple memory sub-systems via a same communication connection, multiple separate communication connections, and/or a combination of communication connections.

In some embodiments, the computing device is a system including one or more processing devices. Examples of the processing device can include a microcontroller, a central processing unit (CPU), special purpose logic circuitry (e.g., a field programmable gate array (FPGA), an application specific integrated circuit (ASIC), etc.), a system on a chip (SoC), or another suitable processor.

Although some of the drawings illustrate a number of operations in a particular order, operations which are not order dependent may be reordered and other operations may be combined or broken out. While some reordering or other groupings are specifically mentioned, others will be apparent to those of ordinary skill in the art and so do not present an exhaustive list of alternatives. Moreover, it should be recognized that the stages could be implemented in hardware, firmware, software or any combination thereof.

In the foregoing specification, the disclosure has been described with reference to specific exemplary embodiments thereof. It will be evident that various modifications may be made thereto without departing from the broader spirit and scope as set forth in the following claims. The specification and drawings are, accordingly, to be regarded in an illustrative sense rather than a restrictive sense.

What is claimed is:

1. A device comprising:
    a memory array, the memory array comprising a plurality of addressable memory cells;
    a temperature sensor positioned at a first location with respect to the memory array, the temperature sensor configured to record an average temperature of the memory array; and
    a controller, the controller positioned at a second location with respect to the memory array, the controller configured to:
        receive an operation from a host processor, the operation accessing one or more of the memory cells of the memory array,
        identifying the operation as a critical operation or a non-critical operation based on one or more of a flag included in the operation, an address of the operation, or a data format of the operation,
        when the operation is identified as a critical operation: retrieving a temperature value of the memory array from the temperature sensor and conditionally processing the critical operation based on the temperature value, and
        process the operation irrespective of the temperature value when the operation is identified a non-critical operation.

2. The device of claim 1, wherein the critical operation comprises a critical read operation, the critical read operation including an address.

3. The device of claim 2, the controller further configured to:
    query a critical access table using the address, the querying returning a plurality of addresses distributed among the plurality of addressable memory cells;
    read temperature data from the plurality of addresses; and
    process the critical read operation based on the temperature data and the temperature value returned by the temperature sensor.

4. The device of claim 3, wherein processing the critical read operation comprises executing a majority voter function on the temperature data, the majority voter function returning a selected temperature value from the temperature data.

5. The device of claim 4, wherein processing the critical read operation comprises determining that the temperature value is within a pre-configured range from the selected temperature value and reading data at the address included in the critical read operation.

6. The device of claim 5, wherein processing the critical read operation comprises determining that the temperature value is not within a pre-configured distance from the selected temperature value and returning an error.

7. The device of claim 1, the critical operation comprising a critical write operation.

8. The device of claim 7, wherein conditionally processing the critical operation comprises writing the temperature value to a plurality of locations in the memory array.

9. The device of claim 8, wherein writing the temperature value to a plurality of locations in the memory array comprises writing the temperature value to a plurality of single-level cell (SLC) locations in the memory array.

10. A method comprising:
  receiving a first and a second operation from a host processor, the first and second operations accessing one or more of memory cells of a memory array,
  identifying the first operation as a critical operation based on one or more of a flag included in the operation, an address of the operation, or a data format of the operation,
    retrieving a temperature value of the memory array from a temperature sensor; and conditionally processing the critical operation based on the temperature value, and
    identifying the second operation as a non-critical operation based on one or more of a flag included in the operation, an address of the operation, or a data format of the operation, and
  processing the non-critical operation irrespective of the temperature value.

11. The method of claim 10, wherein the critical operation comprises a critical read operation, the critical read operation including an address.

12. The method of claim 11, further comprising:
  querying a critical access table using the address, the querying returning a plurality of addresses distributed among a plurality of addressable memory cells of the memory array;
  reading temperature data from the plurality of addresses; and
  processing the critical read operation based on the temperature data and the temperature value returned by the temperature sensor.

13. The method of claim 12, wherein processing the critical read operation comprises executing a majority voter function on the temperature data, the majority voter function returning a selected temperature value from the temperature data.

14. The method of claim 13, wherein processing the critical read operation comprises determining that the temperature value is within a pre-configured range from the selected temperature value and reading data at the address included in the critical read operation.

15. The method of claim 14, wherein processing the critical read operation comprises determining that the temperature value is not within a pre-configured distance from the selected temperature value and returning an error.

16. The method of claim 10, the critical operation comprising a critical write operation.

17. The method of claim 16, wherein conditionally processing the critical operation comprises writing the temperature value to a plurality of locations in the memory array.

18. The method of claim 17, wherein writing the temperature value to a plurality of locations in the memory array comprises writing the temperature value to a plurality of single-level cell (SLC) locations in the memory array.

19. The method of claim 16, wherein conditionally processing the critical operation comprises writing the temperature value to a critical access table, the critical access table storing a mapping of data addresses to locations in the memory array.

20. A non-transitory computer readable storage medium for tangibly storing computer program instructions capable of being executed by a computer processor, the computer program instructions defining steps of:
  receiving an operation from a host processor, the operation accessing one or more of memory cells of a memory array,
  identifying the operation as a critical operation or a non-critical operation based on one or more of a flag included in the operation, an address of the operation, or a data format of the operation,
  when the operation is identified as a critical operation:
  retrieving a temperature value of the memory array from a temperature sensor;
  and, and
  conditionally processing the critical operation based on the temperature value, and
  processing the operation irrespective of the temperature value when the operation is identified a non-critical operation.

* * * * *